United States Patent
Gao et al.

(10) Patent No.: US 10,269,654 B1
(45) Date of Patent: Apr. 23, 2019

(54) METHODS, APPARATUS AND SYSTEM FOR REPLACEMENT CONTACT FOR A FINFET DEVICE

(71) Applicant: GLOBALFOUNDRIES INC., Grand Cayman (KY)

(72) Inventors: Jinsheng Gao, Clifton Park, NY (US); Daniel Jaeger, Saratoga Springs, NY (US); Michael Aquilino, Gansevoort, NY (US); Patrick Carpenter, Saratoga Springs, NY (US); Jessica Dechene, Watervliet, NY (US); Huy Cao, Rexford, NY (US); Mitchell Rutkowski, Ballston Spa, NY (US); Haigou Huang, Rexford, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/890,246

(22) Filed: Feb. 6, 2018

(51) Int. Cl.
| H01L 21/00 | (2006.01) |
| H01L 21/8238 | (2006.01) |
| H01L 29/66 | (2006.01) |
| H01L 29/06 | (2006.01) |
| H01L 27/092 | (2006.01) |

(52) U.S. Cl.
CPC ........ *H01L 21/823814* (2013.01); *H01L 21/823821* (2013.01); *H01L 21/823828* (2013.01); *H01L 21/823878* (2013.01); *H01L 27/0924* (2013.01); *H01L 29/0649* (2013.01); *H01L 29/66545* (2013.01)

(58) Field of Classification Search
CPC ..... H01L 21/823814; H01L 21/823821; H01L 21/823828; H01L 21/823878; H01L 29/66545; H01L 29/0649; H01L 27/0924
See application file for complete search history.

(56) References Cited

U.S. PATENT DOCUMENTS

| 9,984,970 B1* | 5/2018 | Haigh .................. H01L 23/528 |
| 10,121,702 B1* | 11/2018 | Park .................. H01L 21/76897 |
| 2018/0233412 A1* | 8/2018 | Xie .................. H01L 21/823425 |

* cited by examiner

*Primary Examiner* — Richard A Booth
(74) *Attorney, Agent, or Firm* — Williams Morgan, P.C.

(57) ABSTRACT

At least one method, apparatus and system disclosed herein involves forming trench silicide region contact. A plurality of fins are formed on a semiconductor substrate. An epitaxial (EPI) feature is formed at a top portion of each fin of the first portion over a first portion of the fins. A gate region is formed over a second portion of the fins. A replacement metal gate (RMG) process is performed in the gate region. A trench is formed in a portion of the gate region. A void is formed adjacent the a portion of the gate region. A first silicon feature is formed in the trench. A second silicon feature is formed in the void. A TS cut region is formed over the trench. The first silicon feature and the second silicon feature are removed. A metallization process is performed in the void to form a contact.

20 Claims, 8 Drawing Sheets

METHODS, APPARATUS AND SYSTEM FOR REPLACEMENT CONTACT FOR A FINFET DEVICE

BACKGROUND OF THE INVENTION

Field of the Invention

Generally, the present disclosure relates to the manufacture of sophisticated semiconductor devices, and more specifically, to using a silicon or carbon pillar for performing replacement metal process for forming contact regions.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one of various techniques, a plurality of fins are formed on substrate. A plurality of layers of materials that may be deposited on the fins. Some of the fins are designated to be source or drain fins, while a gate area is formed above the fins between the source and drain regions. In the gate area, dummy gate regions are formed over the fins. In a predetermined location, a trench silicide (TS) region is formed between portions of the dummy gate region. Subsequently, metallization processes are performed to form metal contact regions, including above epitaxial (EPI) regions. In many cases, when performing state of the art processes for etching contact regions, gouging of materials below the contact regions may occur, particularly in smaller finFET devices. This may cause various problems, such as damage to the EPI regions, spacer erosion, etc.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for forming trench silicide region contact. A plurality of fins are formed on a semiconductor substrate. An epitaxial (EPI) feature is formed at a top portion of each fin of the first portion over a first portion of the fins. A gate region is formed over a second portion of the fins. A replacement metal gate (RMG) process is performed in the gate region. A trench is formed in a portion of the gate region. A void is formed adjacent a portion of the gate region. A first silicon feature is formed in the trench. A second silicon feature is formed in the void. A TS cut region is formed over the trench. The first silicon feature and the second silicon feature are removed. A metallization process is performed in the void to form a contact.

BRIEF DESCRIPTION OF THE DRAWINGS

The disclosure may be understood by reference to the following description taken in conjunction with the accompanying drawings, in which like reference numerals identify like elements, and in which.

Figure 1:
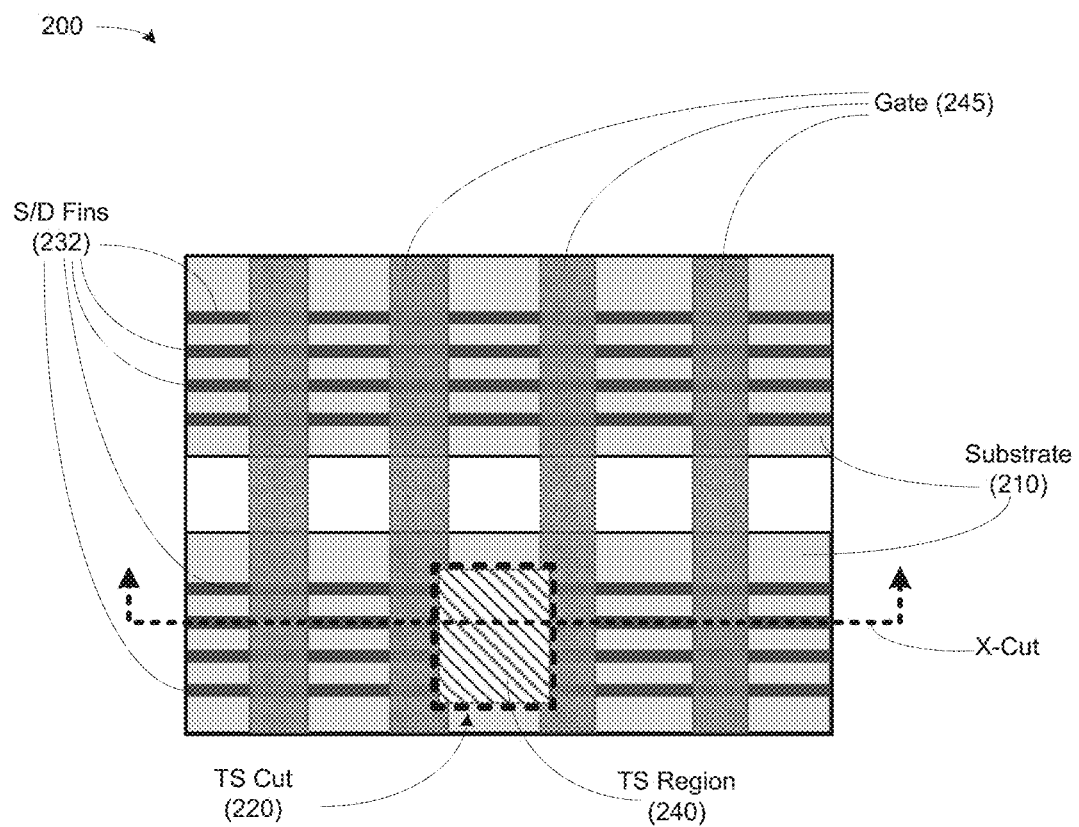
FIG. 1 illustrates a stylized, simplified plan view of a finFET device, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming a gate region for a finFET device, performing a trench (e.g., a shallow isolation (STI) cut process in the gate region, and depositing dielectric material into the STI trench formed by the STI trench cut process. The trench cut process may be performed to form a TS cut region. A replacement dielectric material deposition process that includes depositing dummy silicon or carbon material may be performed. A TS cut pattering and etch processes may be performed, followed by a silicon or carbon removal process. A metallization process may be performed to form contacts. This process may provide various advantages, including reduced gouging of material below the metallization layer, reduced EPI damage, reduces spacer erosion, etc.

Turning now to FIG. 1, a stylized, simplified top view of a finFET device, in accordance with embodiments herein, is illustrated. FIG. 1 illustrates an integrated circuit device 200 comprising a plurality of fins 232 formed on a substrate 210. Further, FIG. 1 illustrates a plurality of gates formations 245. In some embodiments, the device 200 may include an a-Si formation in an oxide layer. Adjacent some of the gates formations 245 are a plurality of TS cut 220, wherein a TS region 240 may be formed. The TS region 240 may eventually become source/drain contacts.

FIG. 1 also shows an X-cut line provided for reference with respect to a cross-sectional view shown in subsequent figures. FIGS. 2-11 represent stylized cross-sectional views of finFET devices with respect to the X-cut line, in accordance with exemplary embodiments herein. Those skilled in the art would appreciate that the TS region 240 is provided for exemplary and illustrative purposes and that other trench regions may be formed on the device 200.

Figure 2:
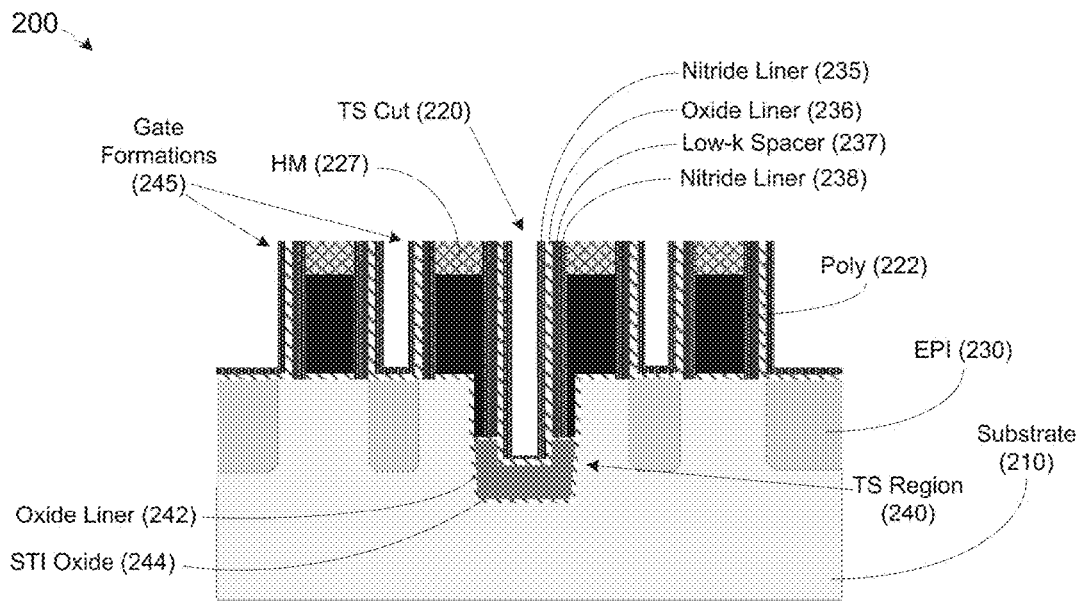
FIG. 2 illustrates a stylized depiction of a cross-sectional view across a plurality of gate regions and over fins, in accordance with embodiments herein.

FIG. 2 illustrates a stylized depiction of a cross-sectional view across a plurality of gate regions over fins, in accordance with embodiments herein. The device 200 comprises a substrate 110 on which source/drain fins 232, EPI features 230, and gate regions are formed. The gate regions comprise a plurality of gate formations 245. Each of the gate formations 245 comprises a poly gate region 222, formed from using a poly gate material (e.g., polysilicon). The poly gate region 222 (or dummy gate region) may be encompassed by a nitride liner 235, an oxide liner 236, a low-k spacer 237, and a nitride liner 238. Further, a hardmask (HM) layer 227 is formed above the poly gate region 222.

In some embodiments, an inter-layer dielectric (ILD) process may be performed. Within the gate region, the TS cut region 220 may be formed to form a TS region 240. The HM layer 227 protects the remaining portion of the gate region when performing a TS cut process. The TS cut 220 also comprises the combination of the nitride liner 235, the oxide liner 236, the low-k spacer 237, and the nitride liner 238. At the bottom portion of the TS cut region 220, an oxide liner 242 encompasses an oxide layer 244 (e.g., a shallow isolation trench (STI) oxide material).

Figure 3:
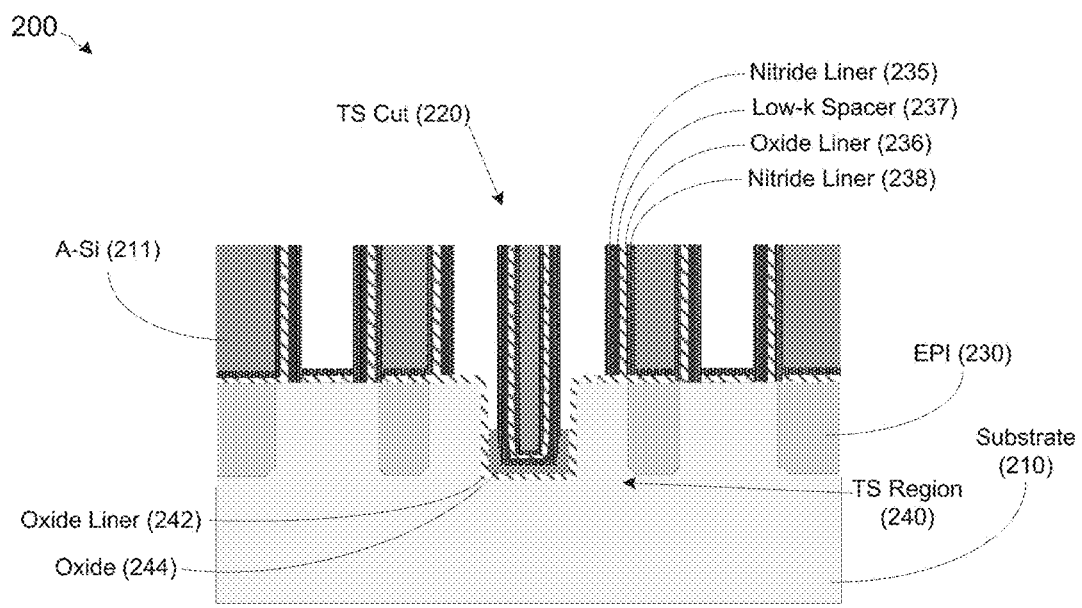
FIG. 3 illustrates a stylized depiction of a cross-sectional view of the finFET device of FIG. 2 with respect to with respect to a poly pull process, in accordance with embodiments herein.

A poly pull process may then be performed. FIG. 3 depicts the device 200 with respect to a poly pull process in accordance with embodiments herein. FIG. 3 shows a substrate 210 on which source drain fins, EPI features 230, and a gate region are formed.

In some embodiments, an amorphous silicon (a-Si) deposition process may be performed to deposit an a-Si layer 211 within the oxide layer. In other embodiments, the layer 211 may represent an oxide layer. The poly-pull process may comprise a dummy gate pull process for creating a plurality of voids for forming metal features. This process may include performing a poly open CMP (POC) process for exposing the dummy gate region 222. An etch process (e.g., a poly-etch process) for removing the dummy gate material (e.g., poly-silicon material) from the dummy region 222 may be performed. FIG. 3 depicts the device 200 after the poly material 222 (FIG. 2) is removed.

Within the gate region, the TS cut 220 is formed to form the TS region 240. The TS cut 220 comprises a tri-layer 239 on the sidewalls of the fins. FIG. 3 depicts a plurality of oxide layer formations 211 is surrounded by the SiN liner 235 and the nitride liner/low-k spacer combination 237. At the bottom portion of the TS cut region 220, a nitride liner 242 encompasses an oxide layer 244.

Figure 4:
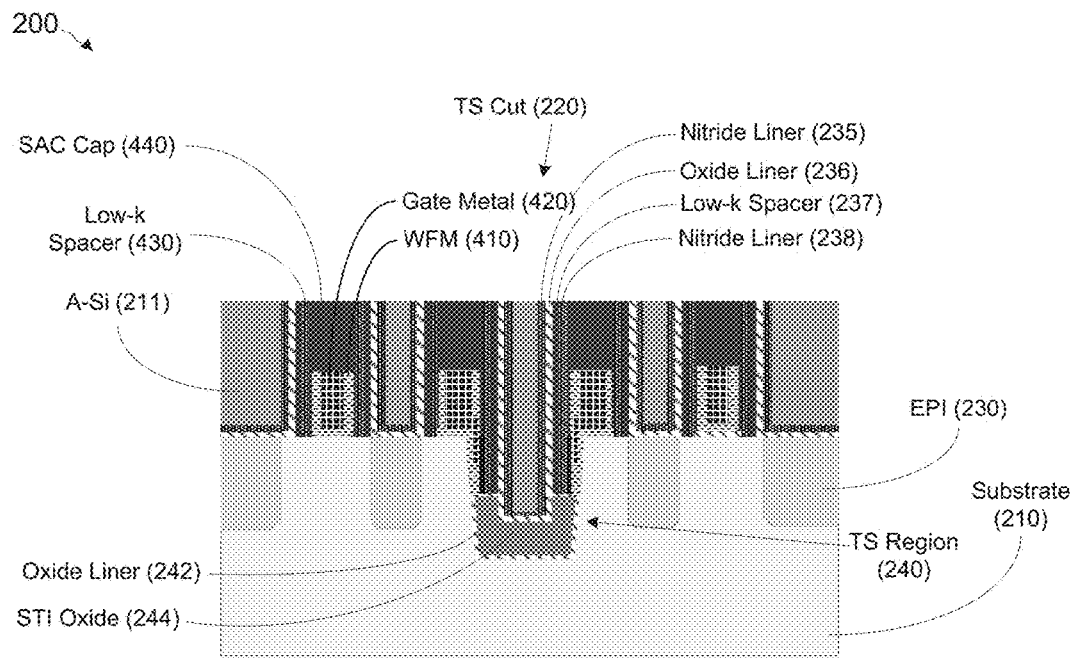
FIG. 4 illustrates a stylized depiction of a cross-sectional view of the finFET device with respect to an RMG process and a SAC process, in accordance with embodiments herein.

After performing the poly-pull process, a replacement metal gate (RMG) process and a self-aligned cap (SAC) process may be performed. FIG. 4 depicts a cross-sectional view of the finFET device 200 with respect to an RMG process and a SAC process, in accordance with embodiments herein.

The RMG process includes depositing a gate metal in each of the gate features in place of the dummy gates 222. A low-k spacer 430 may be deposited adjacent the SiN liner 235. The poly gate material in the dummy gate region 222 is replaced with a work function metal (WFM) layer 410 and a gate metal layer 420.

P-type and N-type work metal materials are respectively added to form NMOS and PMOS devices prior to deposition of a gate metal. In some of the voids, N-type work function metal material (nWF) is deposited, while in other voids, P-type work function metal material (pWF) is deposited.

In some embodiments, the gate metal 420 may be tungsten, while in other embodiments, the gate metal 420 may be or cobalt or copper. Subsequently, a metal gate CMP process may be performed to polish the gate metal 420 to a predetermined height.

Upon depositing the gate metal 420, a self-aligned contact (SAC) cap formation process may be performed. SAC cap formation process may be comprised of recessing gate metal 420, deposition of a SAC cap dielectric material, and CMP of the SAC cap dielectric. This process results in a SAC cap 440 being formed above the gate metal 420. In one embodiment, the SAC cap 440 is formed by depositing silicon nitride using low-pressure chemical vapor deposition (LP-CVD) to a thickness of from about 15 nm to about 80 nm, e.g., about 40 nm. In some embodiments, the cap layer may be utilized as a mask during subsequent processes, such as a TS metallization process. FIG. 4 depicts the device 200 after performing the RMG and SAC processes.

Figure 5:
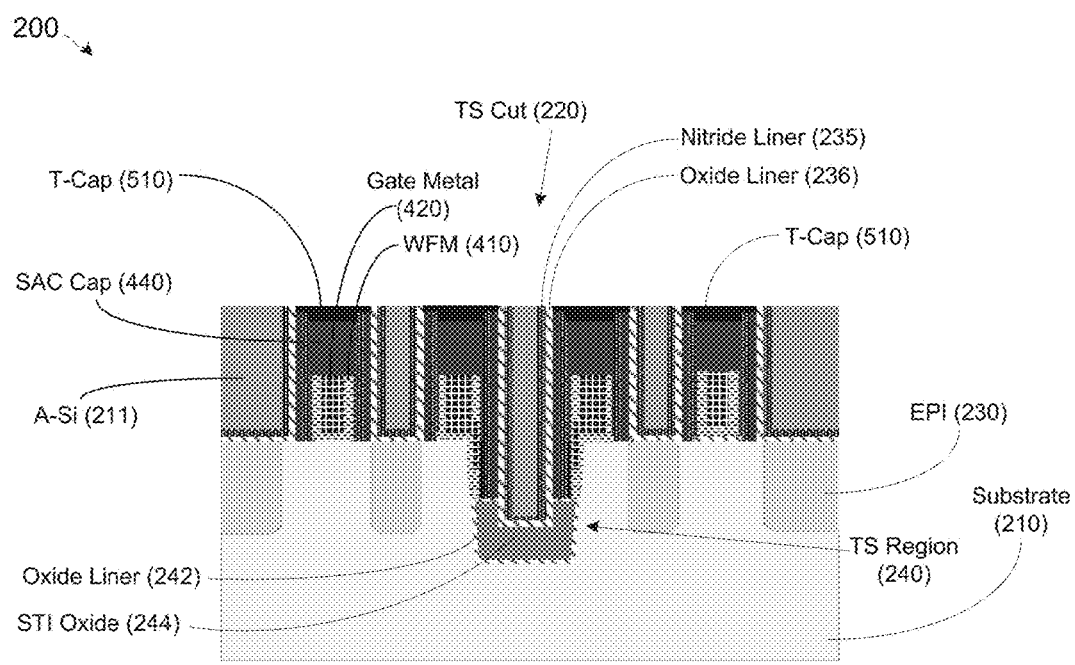
FIG. 5 illustrates a stylized depiction of a cross-sectional view of the finFET device with respect to a T-cap process, in accordance with embodiments herein.

Upon performing the RMG and SAC processes, a dielectric cap process, e.g., a "Sparc T-cap" process may be performed. FIG. 5 depicts a cross-sectional view of the finFET device 200 with respect to a T-cap process, in accordance with embodiments herein. The T-cap process comprises performing a plurality of steps.

A partial SAC cap recess process may be performed to remove a portion of the SAC cap 440 down to a predetermined height. A void roughly in the form of a "T" may be formed in the top portion of the SAC cap 440. Subsequently, an SiOC deposition process may be performed into the void. The deposition of the SiOC material may be performed using a chemical vapor deposition process (CVD) process. A planarization process may be performed on the deposited SiOC material, thereby forming a T-cap layer 510 over the SAC caps 440.

Figure 6:
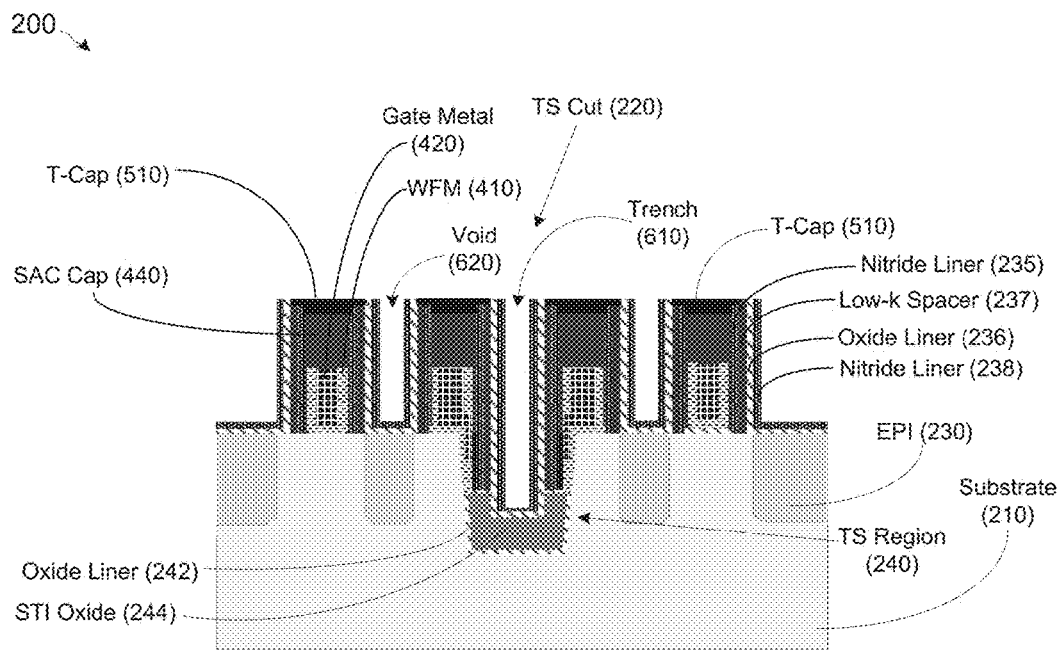
FIG. 6 illustrates a stylized cross-sectional view of the device, with respect to an oxide removal process, in accordance with embodiments herein.

After forming the T-cap features 510, an oxide removal process may be performed. This may be a full oxide removal process. FIG. 6 depicts a cross-sectional view of the finFET device 200 with respect to an oxide removal process, in accordance with embodiments herein. An oxide layer removal process known to those skilled in the art may be performed. This process removes the oxide layer in the exposed portions of the device 200, which may be referred to as a full oxide removal process. The removal of the oxide layer results in a trench 610 in the TS cut region 220, as well as voids 620 shown in FIG. 6.

Figure 7:
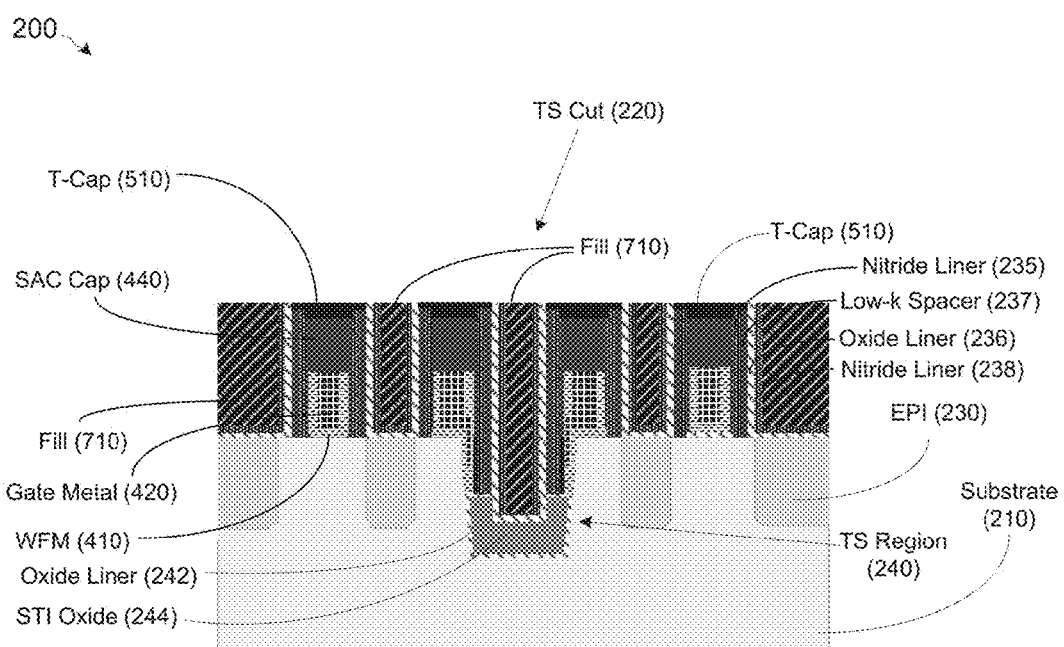
FIG. 7 illustrates a cross-sectional view of the finFET device with respect to an Si fill process and a Si planarization process, in accordance with embodiments herein.

After performing the oxide layer removal process, an Si fill process and an Si planarization process may be performed. FIG. 7 depicts a cross-sectional view of the finFET device 200 with respect to an Si fill process and an Si planarization process, in accordance with embodiments herein. The trench 610 in the TS cut region 220 and the voids 620 (FIG. 6) are filled with a fill material 710 that is easier to etch. The fill material 710 is a dielectric material that is relatively easier to etch away with reducing the probability of eroding spacer or liner material, damaging EPI features 230, and/or damaging contact area.

In one embodiment, the fill material 710 is a silicon fill material, forming silicon pillars. In an alternative embodiment, the fill material 710 is a carbon fill material, forming carbon pillars. In the context of the device 200, etching silicon or carbon may be more efficient and less damaging than etching other materials, e.g., oxide.

Further, a planarizing process may be performed to reduce the height of the fill material 710 to the height of the top portions of the device 200, as exemplified in FIG. 7. The planarizing process may be performed by CMP process configured to planarize the fill material 710 (e.g., silicon fill material, carbon fill material).

Figure 8:
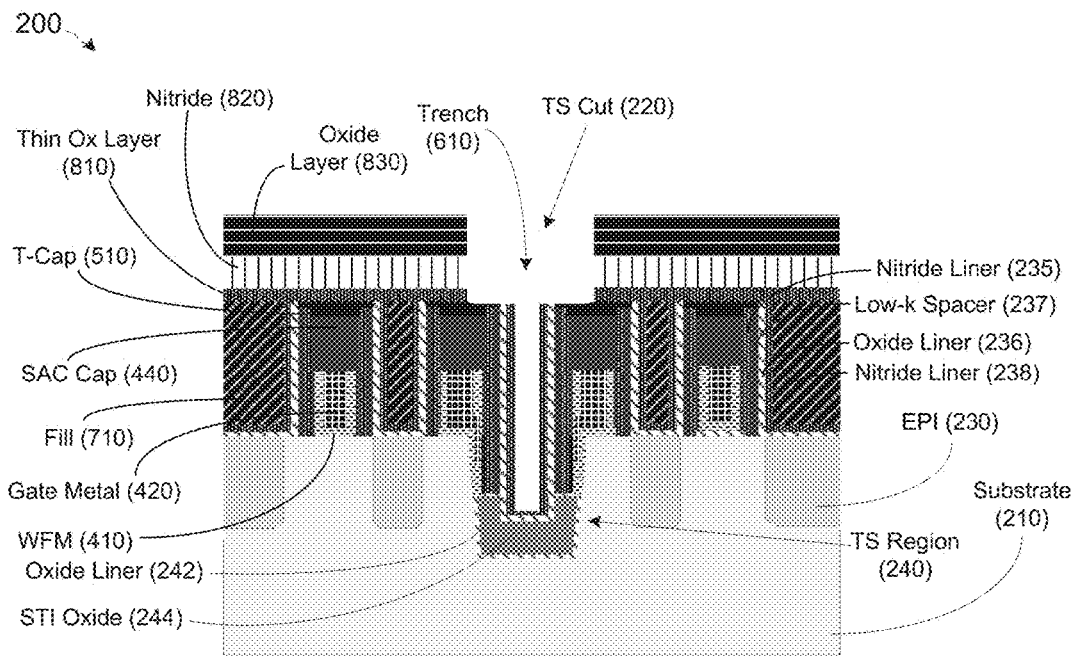
FIG. 8 illustrates a cross-sectional view of the finFET device with respect to an TS cut patterning and an Si etch process, in accordance with embodiments herein.

Upon performing the fill process and planarization, a TS cut pattering process and an Si etch process may be performed. FIG. 8 depicts a cross-sectional view of the finFET device 200 with respect to a TS cut patterning and an Si etch process, in accordance with embodiments herein.

The TS cut patterning process may include depositing various layers and removing portions of those layers in the TS cut region 220. For example, a thin oxide layer or liner 810 may be formed over the T-caps 510. The oxide liner 810 may be comprised of $SiO_2$, SiON, or the like. Further, a nitride layer 820 may be formed on the layer 520. Further, an oxide layer 830 may be formed over the nitride layer 820. In some embodiments, the oxide layer 830 may be SiN, SiOCN, SiBCN, or SiCO layer. In one embodiment, an atomic layer deposition (ALD) process may be performed to deposit the oxide layer 830. The thin oxide layer 810 is thin relative to the oxide layer 830.

The TS cut patterning process also includes removing a portion of the thin oxide, nitride, and oxide layers 810, 820, 830, as well as a portion of the T-caps 510 in the TS cut region 220. FIG. 8 shows a break in these layers that represents the TS cut 220 area. An etch process, e.g., a reactive ion etch process, a dry etch, a wet etch, etc. may be performed to pattern an opening in the layers 810, 820, 830, and the T-caps 510 to pattern the TS cut region 220.

Subsequently, a fill etch process may be performed for removing the fill material 710 in the TS trench 610 in the TS cut region 220. In the embodiment wherein the fill material 710 is silicon, an Si etch process is performed. Si etching is easier to perform and has the advantage of not etching oxide regions, i.e., Si etching is more selective to oxide. Therefore, damage to other layers/portions (e.g., SiOC regions) of the device 200 is reduced.

In the embodiment wherein the fill material 710 is carbon, a carbon etch process is performed. Carbon etching is also easier to perform and has various advantages. For example, ashing process for removing carbon layers is more efficient and easier. Over-etching with respect to carbon etching causes fewer problems. Further, EPI features are generally substantially not damaged or disturbed when performing carbon etching, i.e., carbon etching is generally selective to EPI features. Therefore, removing silicon or carbon in the manner described in embodiments herein provides various advantages, such as the ability to perform a more gentle etching process, reduction in spacer erosion, reduction in EPI damage, reduction in damages to contact regions, etc.

Figure 9:
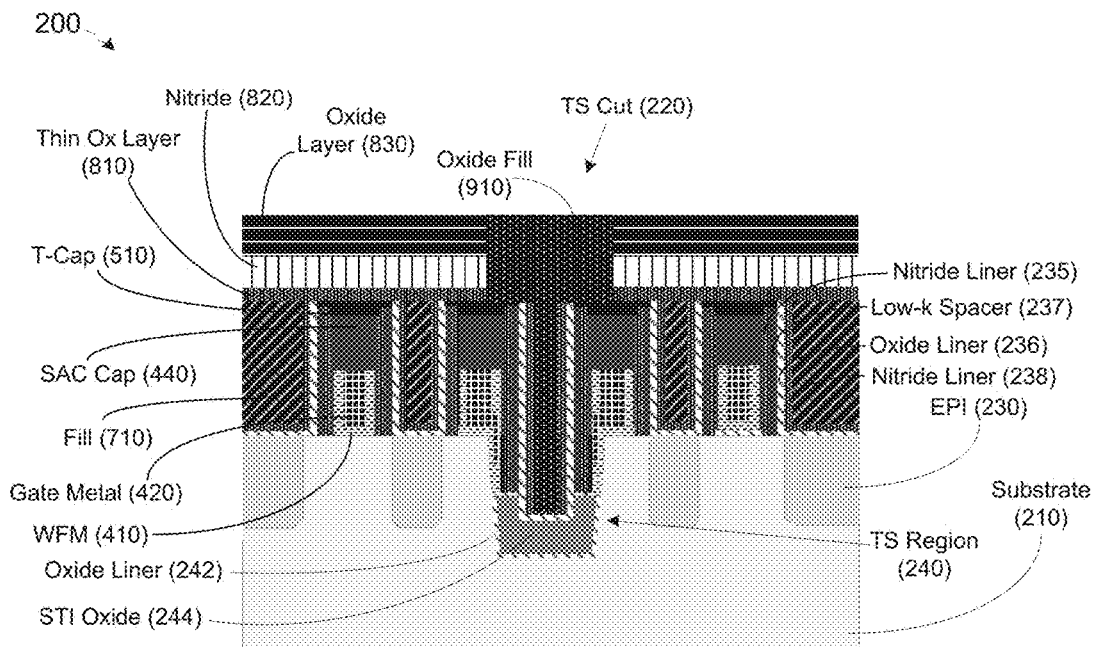
FIG. 9 illustrates a cross-sectional view of the finFET device 200 with respect to an oxide fill process and a planarization process, in accordance with embodiments herein.

An oxide fill process and a planarization process may then be performed. FIG. 9 illustrates a cross-sectional view of the finFET device 200 with respect to an oxide fill process and a planarization process, in accordance with embodiments herein. An oxide layer 910 may be formed into the unoccupied regions in the TS cut region 220. This process fills the trench 610 and other portions of the TS cut region 220 with an oxide material. Subsequently, a planarization process may be performed to bring the oxide layer 910 down to level of the nitride layer 820.

Figure 10:
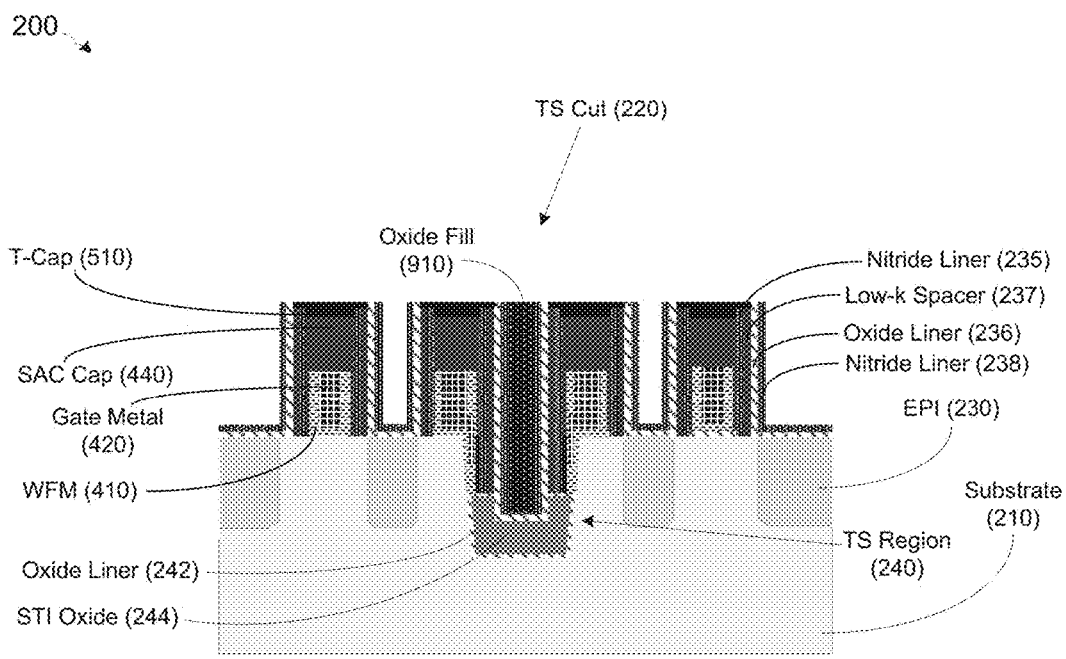
FIG. 10 illustrates a cross-sectional view of the finFET device with respect to a fill material removal process, in accordance with embodiments herein.

Subsequently, a fill material removal process for removing the fill material 710 above the trench 610 of the TS cut 220, may be performed. FIG. 10 illustrates a cross-sectional view of the finFET device 200 with respect to a fill material removal process, in accordance with embodiments herein.

Referring simultaneously to FIGS. 6-10, in one embodiment, the fill material removal process includes a process for removing silicon material from the trench 610 (FIG. 6) of the TS cut region 220. Further, this process removes silicon material from the voids 620, again exposing the voids 610.

In another embodiment, the fill material removal process includes a process for removing carbon material from the region above the trench 610 of the TS cut region 220. The carbon removal process may be performed using an $O_2$ plasma process, an $N_2H_2$ plasma process, etc. Further, this process removes carbon material from the voids 620, again exposing the voids 610. Removal of the fill material 710 (e.g., silicon fill material or carbon fill material) provides for various advantages, high selectivity to other features of the device 200, ease of silicon or carbon material removal, less damage to EPI or contact regions, etc.

Figure 11:
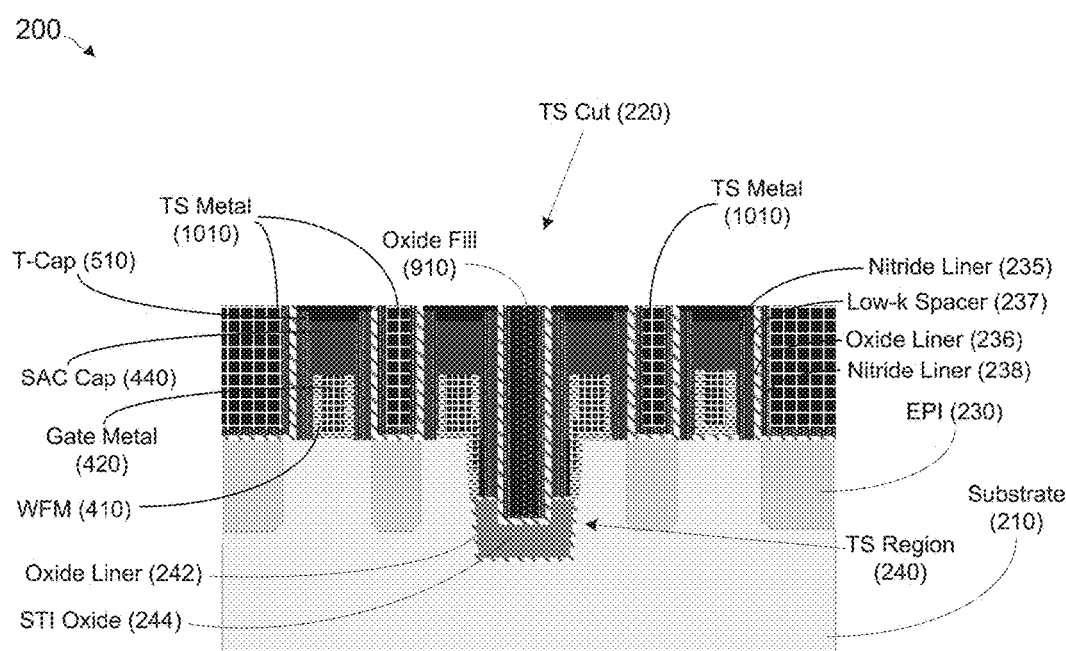
FIG. 11 illustrates a cross-sectional view of the finFET device with respect to a TS metallization process, in accordance with embodiments herein.

Subsequently, a TS metallization process may be performed. FIG. 11 illustrates a cross-sectional view of the finFET device 200 with respect to a TS metallization process, in accordance with embodiments herein. A metal deposition process may be performed for depositing metal in regions outside the TS cut 220 to form TS metal layers 1010. The TS metal layers 1010 may be formed of tungsten, cobalt, or the like. Generally, in order to form the TS metal layers 1010, a metal material is deposited into the voids 610 (FIG. 6) that are not occupied by the dielectric material. Those skilled in the art would appreciate that other processes may be performed in implementing the TS metallization process.

Subsequently, a CMP process may be performed to polish down the TS metal layer 1010 to a predetermined height, e.g., the height of the gate formations. After performing the TS metallization and CMP processes, subsequent processing known to those skilled in the art having benefit of the present disclosure, are performed to complete forming the device 200.

Figure 12:
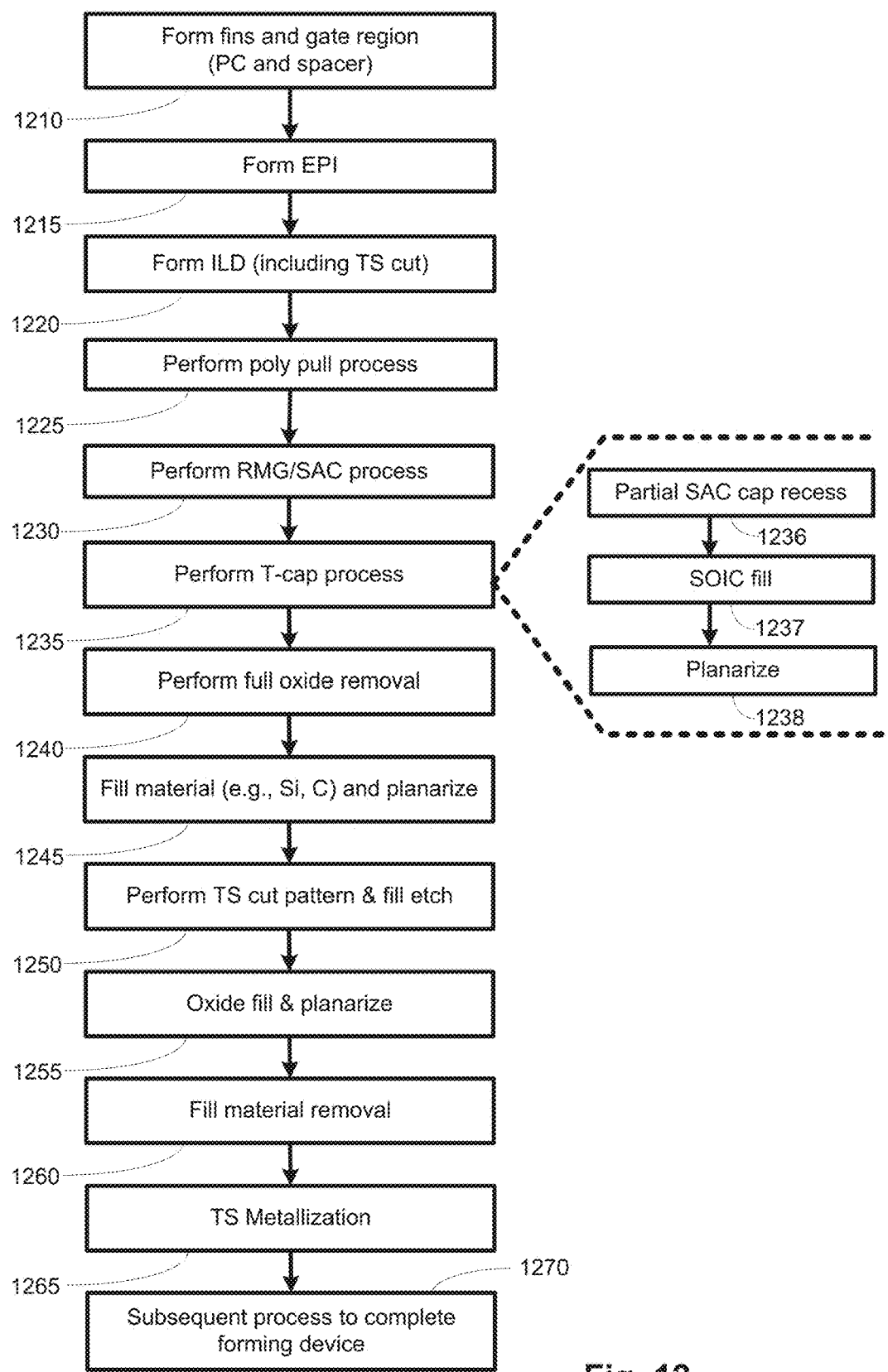
FIG. 12 illustrates a flowchart depiction of a method for manufacturing a device using a new replacement metal contact process, in accordance with embodiments herein.

Turning now to FIG. 12, a flowchart depiction of a method for manufacturing a device using a new replacement metal contact process, in accordance with embodiments herein, is illustrated. A plurality of fins, including PFET and NFET fins, as well as a gate region are formed on a substrate layer (at 1210). Those skilled in the art would appreciate that forming the gate region comprises various process steps, such as forming gate space region, poly gate region, nitride liner, low-k spacer, oxide liner, etc. (see for example, FIG. 2).

Further, using techniques known to those skilled in the art, EPI features may then be formed on the source/drain (S/D) regions (at 1215), as exemplified in FIG. 2. Further, an inter-layer dielectric (ILD) process is performed, which includes performing a TS cut region (at 1220). A fin cut process (e.g., an STI fin cut) may be performed in order to form the TS cut region comprising a TS trench. The TS cut region may comprise an oxide liner, a nitride liner, and a low-k spacer. When forming the TS cut region, a hard mask layer may be deposited to protect S/D and gate regions.

A poly pull process may be performed (at 1225). The poly-pull process may comprise a dummy gate pull process for creating a plurality of voids for depositing metal, as exemplified in FIG. 3. The poly pull process may include a POC process and an etch process for removing the dummy material.

Subsequently, an RMG process may be performed, followed by an SAC process (at 1230). This process may comprise depositing gate metal and a WFM layer. A SAC process may then be performed for form SAC cap features, as exemplified in FIG. 4.

Upon performing the RMG process and the SAC process, a process to form T-caps (e.g., Sparc T-caps) may be performed (at 1235). This process includes performing a partial SAC cap recess to form a region for deposition (at 1236). A layer of SiOC material may be deposited into the void regions (at 1237), followed by a planarization process (at 1238), as exemplified in FIG. 5. Subsequently, a full oxide removal process (at 1240) may be performed, removing the oxide layer in the exposed portions of the device, as exemplified in FIG. 6. This process forms a plurality of voids and a trench in the TS cut region.

A fill material may be deposited into the trench and the voids (at 1245). In one embodiment, the fill material is silicon, while in another embodiment, the fill material is carbon. A planarization process may then be performed to bring the fill material to a predetermined height, as exemplified in FIG. 7. This forms silicon pillars or carbon pillars for replacement metal contacts.

A TS cut pattern and fill material etch process is performed (at 1250). This process may include forming an oxide liner, a nitride layer, and an oxide layer, as exemplified in FIG. 8. This process also includes removing a portion of oxide liner, the nitride layer and the layer layer in the TS cut region. An etch process may be performed to remove the fill material (e.g., Si, C) forming a trench in the TS cut region, thereby removing the silicon or carbon pillars.

An oxide fill process may then be performed, followed by a planarization process (at 1255). The oxide fill process fills oxide material into the trench of the TS cut region, as exemplified in FIG. 9. The planarization process removes the dielectric layer and reduces the oxide fill layer as shown in FIG. 9.

With the oxide layer protecting the TS region, a fill material removal process may be performed (at 1260). In one embodiment the silicon pillars are removed. In another embodiment, the carbon pillars are removed, as exemplified in FIG. 10. This process leaves voids as shown in FIG. 10. A metallization process is then performed (at 1265). The metallization process includes depositing metal material (e.g., tungsten) into regions made into voids due to the removal of the fill material pillars (e.g., Si pillars, C pillars).

Further processes for completing processing/manufacturing of the finFET device 200 may be performed (at 1270). Using principles described herein, those skilled in the art having benefit of the present disclosure would appreciate that the processes described in FIGS. 2-11 may be performed for PMOS devices and for NMOS devices. Further processing may be performed to complete forming the transistor device in accordance with embodiments herein.

Figure 13:
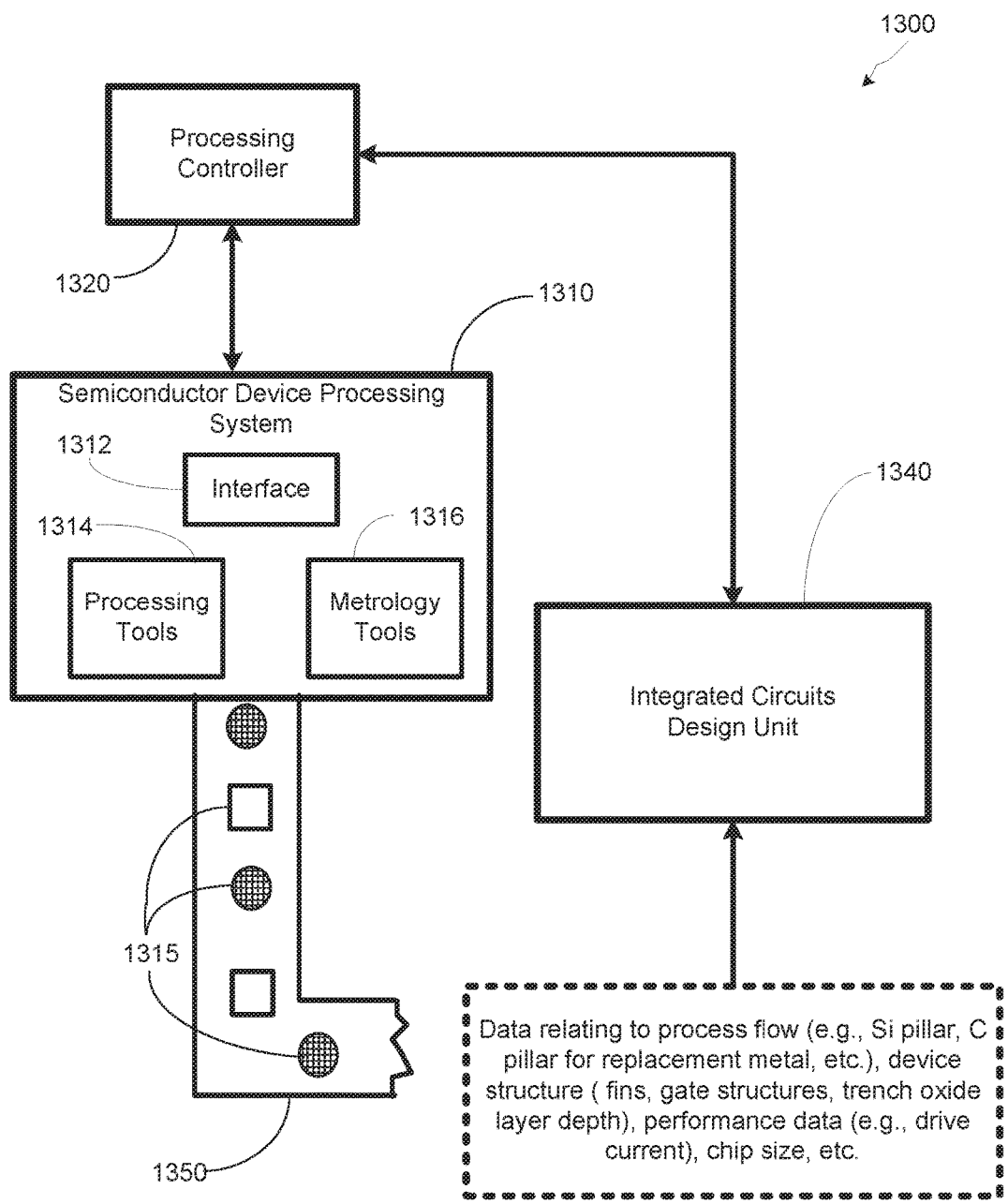
FIG. 13 illustrates a stylized depiction of a system for fabricating a semiconductor device comprising an integrated circuit, in accordance with embodiments herein.

Turning now to FIG. 13, a stylized depiction of a system for fabricating a semiconductor device comprising an integrated circuit, in accordance with embodiments herein, is illustrated. The system 1300 provides for forming a TS trench formation, forming silicon or carbon pillars post-RMG process, and performing replacement metal process for forming contacts. This provides for forming a device having including reduced gouging of material below the metallization layer, reduced EPI damage, reduced spacer erosion, etc.

The system 1300 of FIG. 11 may comprise a semiconductor device processing system 1310 and a design unit 1340. The semiconductor device processing system 1310 may manufacture integrated circuit devices based upon one or more designs provided by the design unit 134.

The semiconductor device processing system 1310 may comprise various processing stations, such as etch process stations, photolithography process stations, oxide deposition process stations, CMP process stations, Epitaxy (EPI) process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 produce integrated circuits having finFET devices that comprise TS trench formations having reduced or substantially eliminated residue at the bottom portion of the trench, as described above.

The production of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps to perform sigma recess regions, filling them with an REO material, and forming EPI features on the REO material, as described above.

In some embodiments, the items labeled "1315" may represent individual wafers, and in other embodiments, the items 1315 may represent a group of semiconductor wafers, e.g., a "lot" of semiconductor wafers. The integrated circuit or device 1315 may be a transistor, a capacitor, a resistor, a memory cell, a processor, and/or the like.

The integrated circuit design unit 1340 of the system 1300 is capable of providing a circuit design that may be manufactured by the semiconductor processing system 1310. The integrated circuit design unit 1340 may be capable of determining the number of devices (e.g., processors, memory devices, etc.) to place in a device package, type of pillars for replacement metal for contact (e.g., Si pillars, C pillars, etc.), and other process specifications. The integrated circuit design unit 1340 may also determine the height of the fins, the size of the fin channels, size of the Si or C pillars, etc. Based upon such details of the devices, the integrated circuit design unit 1340 may determine specifications of the finFETs that are to be manufactured. Based upon these specifications, the integrated circuit design unit 1340 may provide data for manufacturing a semiconductor device having the EPI features provided by embodiments herein.

The system 1300 may be capable of performing analysis and manufacturing of various products involving various technologies. For example, the system 1300 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a plurality of fins on a semiconductor substrate;
    forming, over a first portion of the fins, an epitaxial (EPI) feature at a top portion of each fin of the first portion;
    forming, over a second portion of the fins, a gate region;
    performing a replacement metal gate (RMG) process in the gate region;
    forming a trench in a portion of the gate region;
    forming a void adjacent said a portion of said gate region;
    forming a first silicon feature in said trench;
    forming a second silicon feature in said void;
    forming a TS cut region over said trench;
    removing said first silicon feature and said second silicon feature; and
    performing a metallization process in said void to form a contact.

2. The method of claim 1, wherein performing a replacement metal gate (RMG) process in the gate region comprises:
    performing a poly pull process for removing a poly gate material in a dummy gate area of said gate region;
    depositing a work function metal (WFM) layer in a portion of place of said poly gate material;
    depositing a gate metal over said WFM layer; and
    forming a self-aligned cap (SAC) over said gate metal and said WFM layer.

3. The method of claim 1, wherein forming a trench in a portion of the gate region comprises:
    forming a cap over said SAC; and
    removing a first oxide layer from said TS cut region.

4. The method of claim 3, wherein forming said cap over said SAC comprises:
    removing a portion of said SAC to form a recess in said SAC;
    depositing a SOIC material into said recess in said SAC; and
    performing a planarizing process on said SOIC material.

5. The method of claim 3, wherein forming a void adjacent said a portion of said gate region comprises removing a second oxide layer from a region adjacent said cap and above said EPI feature.

6. The method of claim 1, wherein:
    forming said first silicon feature in said trench comprises depositing a silicon material into said trench and performing a chemical mechanical polishing process on said silicon material; and
    forming said silicon feature in said trench comprises depositing a silicon material into said void and performing a chemical mechanical polishing process on said silicon material.

7. The method of claim 6, wherein forming said TS cut region comprises:
    depositing a thin oxide layer about said trench;
    forming a nitride layer over said thin oxide layer; and
    forming a oxide layer over said nitride layer.

8. The method of claim 7, wherein removing said first silicon feature comprises:
    performing a silicon etch process on said TS cut region;
    depositing an oxide material into said TS cut region;
    removing said low-k space, said ARC layer, and said PR layer; and performing a silicon etch to remove silicon material from said void.

9. The method of claim 8, wherein removing said second silicon feature comprises:
removing said thin oxide layer, said nitride layer, and said oxide layer; and
performing a silicon etch to remove silicon material from said void.

10. The method of claim 1, wherein performing said metallization process in said void to form said contact comprises:
depositing at least one of a tungsten material or a cobalt material into said void; and
performing a CMP process.

11. A method, comprising:
forming a plurality of fins on a semiconductor substrate;
forming, over a first portion of the fins, an epitaxial (EPI) feature at a top portion of each fin of the first portion;
forming, over a second portion of the fins, a gate region;
performing a replacement metal gate (RMG) process in the gate region;
forming a trench in a portion of the gate region;
forming a void adjacent said a portion of said gate region;
forming a first carbon feature in said trench;
forming a carbon feature in said void;
performing a trench silicide (TS) cut process, forming a TS cut region;
removing said first carbon feature and filling said trench with a dielectric material;
removing said second carbon feature; and
performing a metallization process in said void to form a contact.

12. The method of claim 11, wherein forming a trench in a portion of the gate region comprises:
forming a cap over said SAC; and
removing a first oxide layer from said TS cut region;
wherein forming said cap over said SAC comprises:
removing a portion of said SAC to form a recess in said SAC;
depositing a SOIC material into said recess in said SAC; and
performing a planarizing process on said SOIC material.

13. The method of claim 3, wherein:
forming a void adjacent said a portion of said gate region comprises removing a second oxide layer from a region adjacent said cap and above said EPI feature;
forming said first carbon feature in said trench comprises depositing a carbon material into said trench and performing a chemical mechanical polishing (CMP) process on said carbon material; and
forming said carbon feature in said trench comprises depositing a carbon material into said void and performing a CMP process on said carbon material.

14. The method of claim 13, wherein performing said TS cut process comprises:
depositing a oxide liner about said trench;
forming a nitride layer over said thin oxide liner; and
forming a oxide layer over said nitride layer.

15. The method of claim 14, wherein removing said first carbon feature and filling said trench with a dielectric material comprises:
performing a carbon etch process in said TS cut region;
depositing an oxide material into said TS cut region;
removing said oxide liner, said nitride layer, and said oxide layer; and
performing a carbon etch to remove carbon material from said void.

16. The method of claim 15, wherein removing said second carbon feature comprises:
removing said oxide liner, said nitride layer, and said oxide layer; and
performing a carbon etch to remove carbon material from said void.

17. A system, comprising:
a semiconductor device processing system to manufacture a semiconductor device comprising at least one fin field effect transistor (finFET); and
a processing controller operatively coupled to the semiconductor device processing system, the processing controller configured to control an operation of the semiconductor device processing system;
wherein the semiconductor device processing system is adapted to:
form a plurality of fins on a semiconductor substrate;
form, over a first portion of the fins, an epitaxial (EPI) feature at a top portion of each fin of the first portion;
form, over a second portion of the fins, a gate region;
perform a replacement metal gate (RMG) process in the gate region;
form a trench in a portion of the gate region;
form a void adjacent said a portion of said gate region;
form, in said trench, a first pillar made of silicon or carbon;
form, in said void, a second pillar made of silicon or carbon;
form a TS cut region over said trench;
remove said first and second pillars; and
perform a metallization process in said void to form a contact.

18. The system of claim 17, further comprising a design unit configured to generate a first design comprising a definition for a process mask, a definition for forming said trench and void, forming said first and second pillars, and performing said metallization process, wherein data from the design unit is used by the processing controller to control an operation of the semiconductor device processing system.

19. The system of claim 17, wherein said system is further adapted to
deposit a oxide liner about said trench;
form a nitride layer over said thin oxide liner; and
form a oxide layer over said nitride layer.

20. The system of claim 19, wherein said system is further adapted to:
perform at least one of a silicon etch process or a carbon etch process;
deposit an oxide material into said TS cut region;
remove said oxide liner, said nitride layer, and said oxide layer;
perform at least one of a silicon etch or a carbon etch to remove silicon material from said void.

* * * * *